US 6,579,565 B2

(12) United States Patent
Saijo et al.

(10) Patent No.: US 6,579,565 B2
(45) Date of Patent: Jun. 17, 2003

(54) CLAD SHEET FOR PRINTED CIRCUIT BOARD, A MULTILAYERED PRINTED CIRCUIT BOARD USING THEREOF AND MANUFACTURING METHOD THEREOF

(75) Inventors: Kinji Saijo, Yamaguchi (JP); Shinji Ohsawa, Yamaguchi (JP); Kazuo Yoshida, Yamaguchi (JP)

(73) Assignee: Toyo Kohan Co., Ltd., Tokyo (JP)

( * ) Notice: Subject to any disclaimer, the term of this patent is extended or adjusted under 35 U.S.C. 154(b) by 0 days.

(21) Appl. No.: 10/184,968

(22) Filed: Jul. 1, 2002

(65) Prior Publication Data
US 2002/0166840 A1 Nov. 14, 2002

Related U.S. Application Data

(62) Division of application No. 09/744,333, filed as application No. PCT/JP99/03908 on Jul. 22, 1999.

(30) Foreign Application Priority Data

Jul. 23, 1998 (JP) ............................................. 10-222449

(51) Int. Cl.$^7$ ................................................. B05D 5/12
(52) U.S. Cl. ...................... 427/97; 427/123; 427/282; 204/192.32; 216/75; 216/78; 216/95; 216/105
(58) Field of Search ........................... 427/96, 97, 98, 427/123, 282; 204/192.32; 216/75, 95, 105, 78

(56) References Cited

U.S. PATENT DOCUMENTS 4,896,813 A * 1/1990 Saijo et al. .................. 228/116

FOREIGN PATENT DOCUMENTS

| JP | 188660 | * | 8/1991 |
| JP | 15993 | * | 1/1992 |
| JP | 291744 | * | 11/1993 |
| JP | 5664 | * | 1/1996 |

OTHER PUBLICATIONS

Goro T, "Component Mounting Device", Japanese Patent JP 8264971 A (Pub. No. 08–264971), Oct. 11, 1996; Abstract Only.

Hajime et al, "Manufacture of Multilayer Interconnection Board and Insulating Board with Multilayer Metal Layer", Japanese Patent JP 5291744 A (Pub. No. 05–291744, Nov. 5, 1993; Abstract Only.

Masahiro K, "Manufacture of Multilayer Printed Wiring Board", Japanese Patent JP 4015993 A (Pub. No. 04–015993), Jan. 21, 1992; Abstract Only.

* cited by examiner

Primary Examiner—Brian K. Talbot
(74) Attorney, Agent, or Firm—Browdy and Neimark PLLC

(57) ABSTRACT

A multilayered circuit board is produced by:
a. laminating a copper foil conductor layer and a nickel foil or nickel plating etch-stopping layer by simultaneously press-bonding the nickel and copper layer to form a multilayered clad sheet;
b. selectively etching the multilayered clad sheet;
c. forming an insulating layer and an outer conductor layer on the surface of the clad sheet;
d. patterning the outer conductor layer; and
e. electrically connecting the internal conductor layer and the outer conductor layer by interposing a columnar conductor formed in the base by etching.

2 Claims, 4 Drawing Sheets

CLAD SHEET FOR PRINTED CIRCUIT BOARD, A MULTILAYERED PRINTED CIRCUIT BOARD USING THEREOF AND MANUFACTURING METHOD THEREOF

CROSS-REFERENCE TO RELATED APPLICATIONS

The present application is a division of U.S. patent application Ser. No. 09/744,333, filed Feb. 27, 2000, which is the national stage under 35 U.S.C. §371 of PCT/JP99/03908, filed Jul. 22, 1999.

INDUSTRIAL FIELD

The present invention relates to a multilayered primed circuit board applicable to vast integration of semiconductor and a manufacturing method thereof.

BACKGROUND OF THE INVENTION

In these years, a highly integrated assembly board has been required accompanied with the demands for higher integration, more pins and less weight of semiconductor device. In order to accomplish theses demands, research and development for multiplying the layer of a circuit board and improving the circuit integration have been made.

As a method for multiplying the layer, so-called building up method has been developed and is widely used. The method is consisting of laminating insulating layer and circuit layer in which the connection between these layers is accomplished by giving the insulating layer photoetching, forming via holes and then forming a plating layer on the surface. In some cases, laser is used for forming the via holes.

Japanese laid open publication No. Hei 8-264971 discloses a manufacturing method of a multilayered printed circuit board using a building up method. The manufacturing method of this application is simply explained referring FIG. 9 as mentioned below.

At first, the first resin layer 53 is formed in range 52 where any pattern is not formed on internal board 51 having internal conductor pattern 50. The first resin layer 53 is formed so that prescribed clearance 54 is made between the lateral of internal conductor pattern 50 and the first resin layer 53. Next, the second resin layer 55 composing an insulating layer by coating and then hardening resin varnish. The second resin layer 55 fills up clearance 54 and covers internal conductor pattern 50 and the first resin layer 53. Then, adhesive layer 56 is formed on the second resin layer 55 followed by roughening. After that, outer conductor pattern 57 is formed on adhesive layer 56 be electroless plating.

However, the above-mentioned multilayered printed circuit board by building up method has the following problems to be solved.

Namely, in the above-mentioned method, when a multi-layered printed circuit board is manufactured by laminating outer conductor pattern 57 on both sides of internal board having internal conductor pattern 50, complicated processes such as formation of the first resin layer 53, formation of the second resin layer 55 by coating and then hardening resin varnish, and further formation of adhesive layer 56 are required. For this reason, the reduction of cost of a multi-layered printed circuit board using the building up method could not be attained.

There is another manufacturing method of multilayered printed circuit board in which metal thin film is formed by vaporizing. However, the method has a problem that when the film is thin (a few $\mu$m), pores are easily caused, while when the film is thick (10 $\mu$m or more), the productability is deteriorated, which causes high cost.

The present invention aims to solve such problems. The objective of the present invention is to produce a clad sheet for printed circuit board which can be manufactured at low cost and has excellent properties, a multilayered printed circuit board using thereof and a manufacturing method thereof.

DISCLOSURE OF THE INVENTION

The clad sheet for printed circuit board according to the present invention characterized in that it is manufactured by press-bonding a copper foil and a nickel foil at a reduction rate of 0.1 to 3%.

The clad sheet for printed circuit board according to another embodiment of the present invention is characterized in that it is manufactured by press-bonding a copper foil of which one side or both sides have nickel plating layer and another copper foil or a copper foil of which one side has nickel plating layer at a reduction rate of 0.1 to 3%.

The clad sheet for printed circuit board according to the present invention is characterized in that it is a five-layered sheet comprising layers of copper/nickel/copper/nickel/copper.

The multilayered printed circuit board according to the present invention is characterized in that it is comprising:

a base having an internal conductor layer formed by selectively etching the clad sheet for printed circuit board, an insulating layer and an outer conductor layer formed on the surface of said base, said outer conductor layer being made patterning, and the internal conductor layer and the outer conductor layer being electrically connected by inter posing a columnar conductor formed in said base by etching.

The manufacturing method of a multilayered printed circuit board according to the present invention is characterized in that it is comprising:

forming a clad sheet for printed circuit board by laminating a copper foil serving as a conductor layer and a nickel foil or nickel plating serving as an etching-stopper layer and by simultaneously Press-bonding both at the reduction rate of 0.1 to 3%, producing a base by selectively etching said multilayered clad sheet, forming an insulating layer and an outer conductor layer on the surface of said sheet, making patterning said outer conductor layer, and electrically connecting the internal conductor layer end the outer conductor layer by interposing a columnar conductor formed in said sheet by etching.

The manufacturing method according to another embodiment of the present invention is characterized in that:

said clad sheet for printed circuit board is formed by laminating said copper foil and said nickel foil or nickel plating and cold-press-bonding both at the reduction rate of 0.1 to 3% after contacting surfaces of said copper foil and said nickel foil or nickel plating are previously activation-treated in a vacuum chamber, and in that case, said activation treatment is carried out (1) in a hyper low pressure inert gas atmosphere of $1 \times 10^{-1}$ to $1 \times 10^{-4}$ Torr, (2) by glow-discharging charging alternate current of 1 to 50 MHz between an electrode A consisting of said copper foil and said nickel plating having contacting surface which are electrically grounded respectively end other electrode B insulatingly held, and (3) by sputter-etching (4) in the manner that the area of the electrode exposed in plasma generated by said glow-discharging is not more than 1/3 the area of electrode B.

BEST MODE FOR CARRYING OUT THE INVENTION

The present invention will-be concretely explained referring en embodiment shown in accompanied figures below.

Figure 7:
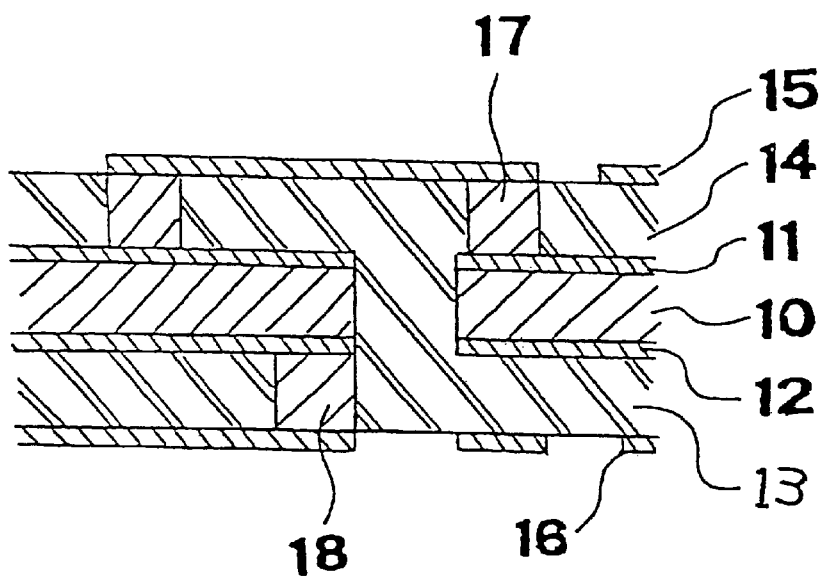
FIG. 7 is a process explanatory view of an embodiment of the manufacturing method of the multilayered printed circuit board of the present invention 6.

At first, the structure of the multilayered printed circuit board, which is an embodiment of the present invention, is explained referring to FIG. 7.

As shown in FIG. 7, a core of base is formed by bonding etching-stopper layer 11, 12 (thickness: 0.5 to 3 $\mu$m) comprising nickel plating to both sides of internal conductor layer 10 (thickness: 10 to 100 $\mu$m) comprising copper foil. Outer conductor layer 15, 16 (thickness: 10 to 100 $\mu$m) comprising copper plating is formed on both sides of internal conductor layer 10 interposed by insulating layer 13, 14 comprising resin. Base is formed by electrically connecting internal conductor layer 10 and outer conductor layer 15, 16 with columnar conductor 17, 18 (thickness: 10 to 100 $\mu$m) comprising copper. And, a multilayered printed circuit board is formed by patterning the surface of outer conductor layer 15, 16.

Next, the manufacturing method of the above-mentioned multilayered primed circuit board is explained.

Figure 1:
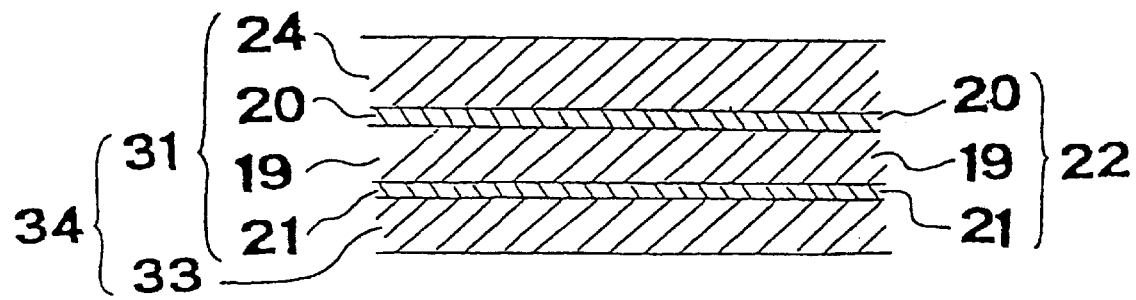
FIG. 1 is a process explanatory view of an embodiment of the manufacturing method of the multilayered printed circuit board of the present invention.

First of all, nickel plated copper foil 22 is prepared by forming nickel plating 20, 21 that is to be etching-stopper layer 11, 12 on both sides of copper foil 19 (thickness: 10 to 100 $\mu$m) that is to be internal conductor layer when the multilayered printed circuit board is completed (see FIG. 1).

Figure 8:
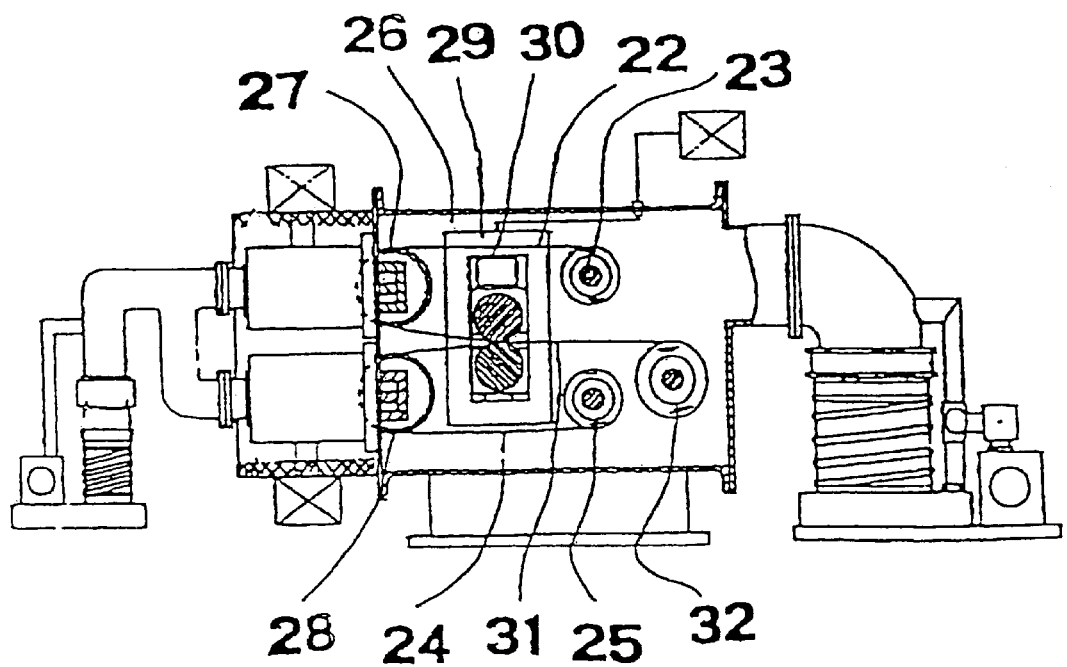
FIG. 8 is a cross-section front view of the manufacturing apparatus of a clad metal sheet.
Figure 9:
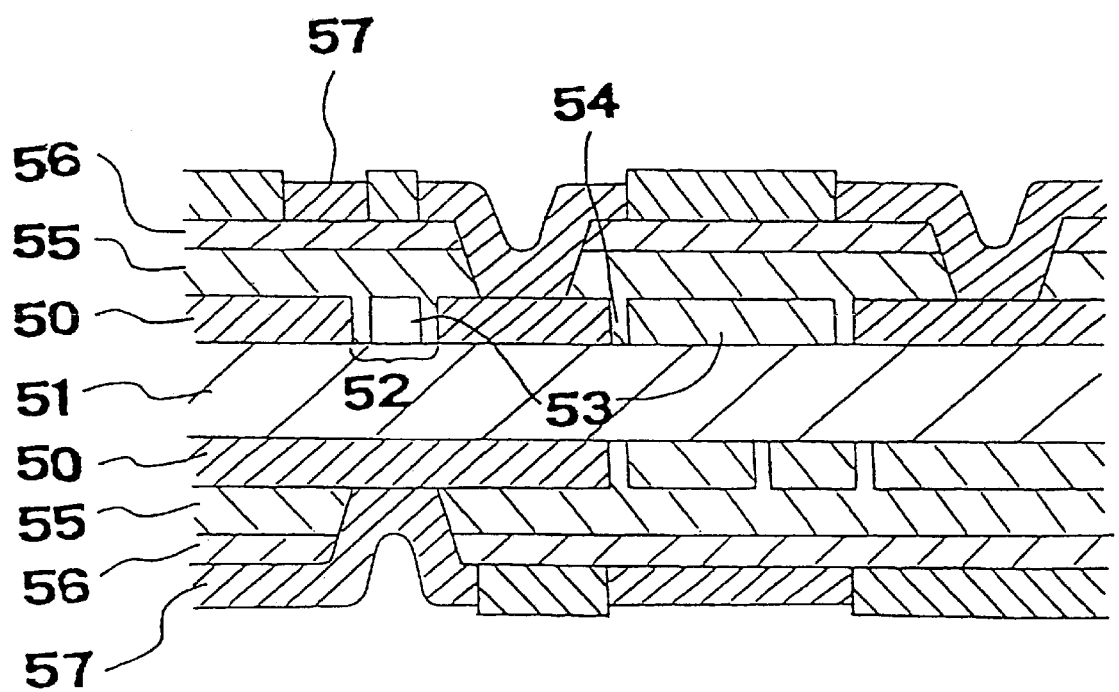
FIG. 9 is a front view of a conventional multilayered printed circuit board.

Nickel plated copper foil 22 is wound around rewinding reel 23 of clad sheet manufacturing apparatus shown in FIG. 8, while copper foil 24 that is to be columnar conductor 17 is wound around rewinding reel 25.

Nickel plated copper foil 22 and copper foil 24 are simultaneously unwound from rewinding reel 23, 25, parts of them are wound around electrode roll 27, 28 juttingly installed in etching chamber 26, and then they are activated by sputter-etching treatment in etching chamber 26.

In this case, the activation treatment is carried out (1) in a hyper low pressure inert gas atmosphere of $1\times10^{-1}$ to $1\times10^{-4}$ Torr, (2) by glow-discharging charging alternate current of 1 to 50 MHz between an electrode A consisting of nickel plated copper foil 22 and copper foil 24 having contacting surface which are electrically grounded respectively end other electrode B insulatingly herd, and (3) by sputter-etching (4) in the manner that the area of the electrode exposed in plasma generated by said glow-discharging is not more than 1/3 the area of electrode B.

After that, they are cold-press-bonded by rolling unit 30 installed in vacuum chamber 29, then clad sheet for printed circuit board 31 having 3 layered structure is taken up around rewinding roll 32.

Next, clad sheet for printed circuit board 31 having 3 layered structure is wound again around rewinding reel 23, while copper foil 33 that is to be columnar conductor 18 (see FIG. 1) is wound around rewinding reel 25. Clad sheet 31 and copper foil 33 are simultaneously unwound from rewinding reel 23, 25, respectively, parts of them are wound around electrode roll 27, 28 juttingly installed in etching chamber 26, and then they are activated by sputter-etching treatment in etching chamber 26.

Also in this case, the activation treatment is carried out (1) in a hyper low pressure inert gas atmosphere of $1\times10^{-1}$ to $1\times10^{-4}$ Torr, (2) by glow-discharging charging alternate current of 1 to 50 MHz between an electrode A consisting of clad sheet for printed circuit board 31 end copper foil 33 having contacting surface which are electrically grounded respectively and other electrode B insulatingly held, and (3) by sputter-etching (4) in the manner that the area of the electrode exposed in plasma generated by said glow-discharging is not more than 1/3 the area of electrode B, and thus clad street for printed circuit board 34 having 5 layered structure.

Further, a multilayered clad sheet formed by copper layers as top and bottom layers and interposed by nickel layer as intermediate layer in the order of copper/nickel/copper/nickel/copper can be manufactured by repeating press-bonding using the above-mentioned apparatus.

Moreover, a multilayered clad sheet can be manufactured by single press-bonding installing 3 or more of the above-mentioned rewinding reel, preparing copper foil and nickel foil on these reels and simultaneously supplying foils from 3 or more of these rewinding reel.

Next, after clad sheet for printed circuit board 39 is cut into required size, a multilayered printed circuit board is manufactured according to the following processes explained referring FIGS. 2 to 7.

Figure 2:
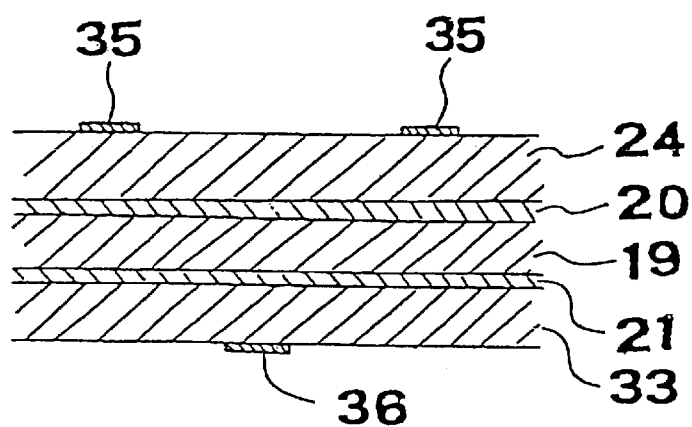
FIG. 2 is a process explanatory view of an embodiment of the manufacturing method of the multilayered printed circuit board of the present invention.

At first, after photoresist film 35, 36 are formed on copper foil 24, 33 as shown in FIG. 2, they are exposed and developed.

Figure 3:
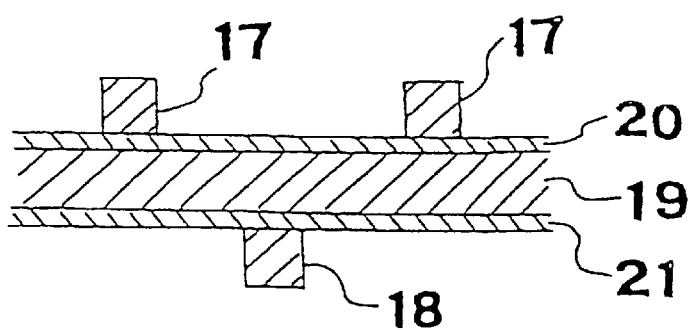
FIG. 3 is a process explanatory view of an embodiment of the manufacturing method of the multilayered printed circuit board of the present invention.

Then, copper foil 24, 33 are selectively etched so that the portion except of columnar conductor 17, 18 are rejected as shown in FIG. 3.

Figure 4:
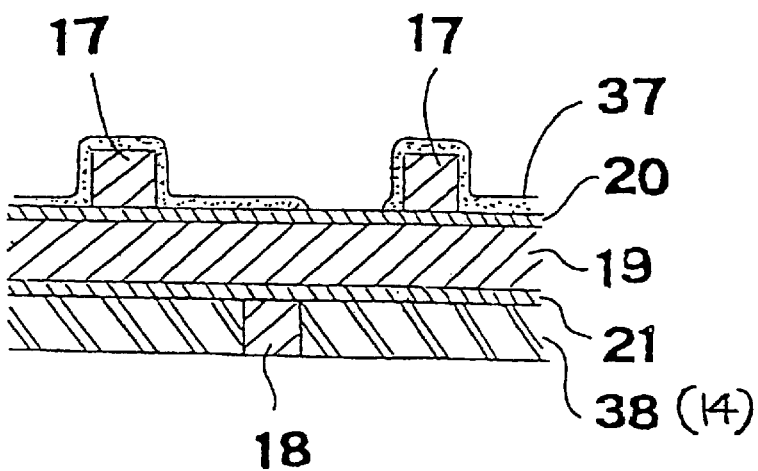
FIG. 4 is a process explanatory view of an embodiment of the manufacturing method of the multilayered printed circuit board of the present invention.

Then, after photoresist film 37 is formed on nickel plating 20, they are exposed and developed, and further, resin 38 is coated on the surface of nickel plating 21 so as to form insulating layer 14 as shown in FIG. 4.

Figure 5:
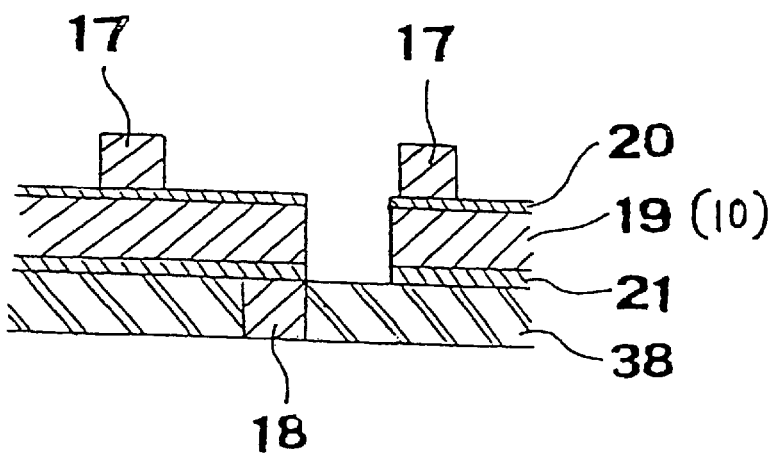
FIG. 5 is a process explanatory view of an embodiment of the manufacturing method of the multilayered printed circuit board of the present invention.

Then, internal conductor layer 10 is formed by etching nickel plating 20, copper foil 19, nickel plating 21 using ferric chloride or sulfuric acid added by hydrogen peroxide as shown in FIG. 5.

Figure 6:
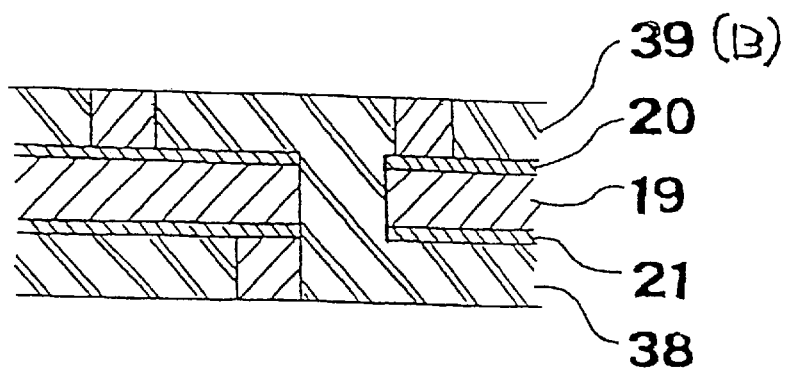
FIG. 6 is a process explanatory view of an embodiment of the manufacturing method of the multilayered printed circuit board of the present invention.

Then, resin 39 is coated on the surface of internal conductor layer 10 so as to form insulating layer 13, and the resin surface is polished to obtain a uniform surface as shown in FIG. 6. In this case, the top of columnar conductor 17 should be exposed.

Then, after the surfaces of resin 38, 39 (see FIG. 6) are roughened, outer conductor layer 16, 15 are formed on the roughened surfaces by electroless or electrolytical copper plating. And then, outer conductor layer 15, 16 are made patterning. Thus, the circuit is formed.

POSSIBILITY OF USE IN INVENTION

As mentioned above, in the clad sheet for printed circuit board, the clad sheet for printed circuit board is manufactured by press-bonding copper foil and nickel foil, or by press-bonding copper foil having nickel plating on one side or both sides of it and other copper foil or copper foil having nickel plating on one side of it in the laminated state, so the quality of the clad sheet for printed circuit board is improved by eliminating pore generation in the manufacturing by vaporizing, and the manufacturing cost can be reduced, since it is manufactured by press-bonding the laminated foils. Further, since the flatness at the bonding interface can be held by controlling the stress at the bonding interface to the low level because of press-bonding et the low reduction rate of 0.1 to 3%, and no alloy is generated at the interface because the heat treatment for recovering the formability is not necessary. The multilayered printed circuit board having excellent selective etchability can be manufactured using these clad sheet for printed circuit board.

In the manufacturing method of a multilayered printed circuit board according to one embodiment of the invention, as a base is formed by selectively etching the above-mentioned clad sheet for printed circuit board, the surface of it is patterned, and electrical connection between conductor layers is accomplished by interposing a columnar conductor formed in said conductor layers by etching, so that a multilayered printed circuit board having highly integrated circuit can be effectively and economically manufactured.

In the manufacturing method of a multilayered printed circuit board according to another embodiment of the present invention, the clad sheet for printed circuit board is formed by laminating a copper foil serving as a conductor layer and nickel plating serving as an etching-stopper layer and by simultaneously press-bonding both, then the base is manufactured by selectively etching the multilayered clad sheet, and then the base is coated by resin, plated and patterned, and electrical connection between said conductor layers is accomplished by interposing a columnar conductor formed in conductor layers by etching, and thus the multilayered printed circuit board is manufactured, so that a multilayered printed circuit board having highly integrated circuit can be affectively end economically manufactured.

In the manufacturing method of a multilayered printed circuit board according to another embodiment of the present invention, as the multilayered clad sheet is formed by previously activation-treating the contacting surface of copper foil and nickel plating in a vacuum chamber followed by laminating the copper foil and said nickel plating then cold-press-bonding both at the reduction rate of 0.1 to 3%, the flatness at the bonding interface can be held by controlling the stress at the bonding interface to the low level and no alloy is generated at the interface because the heat treatment for recovering the formability is not necessary, so that the multilayered printed circuit board having excellent selective etchability can be manufactured using these multilayered clad sheets.

What is claimed is:

1. A method for making a multilayered circuit board comprising:
   a. forming a multilayered clad sheet with copper layers interposed by a nickel layer to form a sheet comprising first copper layer/first nickel layer/second copper layer/second nickel layer/third copper layer;
   b. forming a photoresist film on the first copper layer, exposing the photoresist film to light, and developing the photoresist film;
   c. selectively etching the first copper layer to leave a columnar conductor as the outer copper layer;
   d. forming a photoresist film on the first nickel layer, exposing and developing the photoresist film, and coating the first nickel layer with resin to form a first insulating layer;
   e. forming an internal conduction layer by etching the first nickel layer, the second copper layer, and the second nickel layer;
   f. coating the surface of the internal conduction layer with a resin to form a second insulating layer and polishing the second insulating layer so that the top of the columnar conductor is exposed;
   g. coating the surface of the resin with copper to form an outer conductor layer;
   h. patterning the outer conductor layer.

2. The manufacturing method of the multilayered printed circuit board according to claim 1 characterized in that:
   said core base is formed by laminating said copper foil and said nickel foil or nickel plating and cold-press-bonding both at the reduction rate of 0.1 to 3% after contacting surfaces of said copper foil and said nickel foil or nickel plating are previously activation-treated in a vacuum chamber, wherein,
   said activation treatment is carried out
   (1) in a hyper low pressure inert gas atmosphere of $1 \times 10^{-1}$ to $1 \times 10^{-4}$ Torr,
   (2) by glow-discharging charging alternate current of 1 to 50 MHz between an electrode A consisting of said copper foil and said nickel plating having contacting surface which are electrically grounded respectively and electrode B which is insulatingly held, and
   (3) by sputter-etching
   (4) in the manner that the area of the electrode exposed to plasma generated by said glow-discharge is not more than ⅓ the area of electrode B.

* * * * *